United States Patent
Leobandung

(10) Patent No.: US 10,128,199 B1
(45) Date of Patent: Nov. 13, 2018

(54) INTERCHIP BACKSIDE CONNECTION

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/651,792

(22) Filed: Jul. 17, 2017

(51) Int. Cl.
| | |
|---|---|
| H01L 23/12 | (2006.01) |
| H01L 23/00 | (2006.01) |
| H01L 25/065 | (2006.01) |
| H01L 23/48 | (2006.01) |
| H01L 23/367 | (2006.01) |
| H01L 23/18 | (2006.01) |

(Continued)

(52) U.S. Cl.
CPC ........ *H01L 23/562* (2013.01); *H01L 21/4882* (2013.01); *H01L 21/52* (2013.01); *H01L 21/54* (2013.01); *H01L 23/057* (2013.01); *H01L 23/18* (2013.01); *H01L 23/3675* (2013.01); *H01L 23/481* (2013.01); *H01L 24/05* (2013.01); *H01L 24/45* (2013.01); *H01L 24/48* (2013.01); *H01L 25/0655* (2013.01); *H01L 25/50* (2013.01); *H01L 2224/04042* (2013.01); *H01L 2224/05025* (2013.01); *H01L 2224/05124* (2013.01); *H01L 2224/05147* (2013.01); *H01L 2224/05157* (2013.01); *H01L 2224/05184* (2013.01); *H01L 2224/45124* (2013.01); *H01L 2224/45139* (2013.01); *H01L 2224/45144* (2013.01); *H01L 2224/45147* (2013.01); *H01L 2224/48137* (2013.01); *H01L 2924/351* (2013.01)

(58) Field of Classification Search
USPC .......... 257/774, E33.08, 738, 777, E21.509, 257/E21.575, E23.069, E21.577, 778, 257/784, 713, 621, E23.169, E23.178, 257/686, 723, E25.031–E25.032, 257/E23.042, 41, 81, 82, 9, 199, 257/177–182; 361/706; 438/629, 630, 438/637–640, 668, 672, 652
See application file for complete search history.

(56) References Cited

U.S. PATENT DOCUMENTS

| | | |
|---|---|---|
| 5,784,264 A | 7/1998 | Tanioka |
| 6,114,221 A | 9/2000 | Tonti et al. |

(Continued)

FOREIGN PATENT DOCUMENTS

WO 2014134758 A1 9/2014

*Primary Examiner* — Tram H Nguyen
(74) *Attorney, Agent, or Firm* — Scully, Scott, Murphy & Presser, P.C.; L. Jeffrey Kelly, Esq.

(57) ABSTRACT

A multi-chip module structure (MCM) having improved heat dissipation includes a plurality of semiconductor chips having a front side mounted on a packaging substrate, wherein each semiconductor chip of the plurality of semiconductor chips further includes a through-substrate vias located at a backside of each semiconductor chip of the plurality of semiconductor chips. A plurality of wire bonds is present that provides interconnect between each semiconductor chip of the plurality of semiconductor chips and is located at the backside of each semiconductor chip of the plurality of semiconductor chips. A heat sink is located above a gap containing the plurality of wire bonds, and a cooling element is located on a surface of the heat sink.

17 Claims, 5 Drawing Sheets

(51) Int. Cl.
  *H01L 23/057*  (2006.01)
  *H01L 25/00*  (2006.01)
  *H01L 21/48*  (2006.01)
  *H01L 21/54*  (2006.01)
  *H01L 21/52*  (2006.01)

(56) References Cited

U.S. PATENT DOCUMENTS

| | | |
|---|---|---|
| 6,376,914 B2 | 4/2002 | Kovats et al. |
| 6,475,830 B1 | 11/2002 | Brillhart |
| 6,627,978 B2 | 9/2003 | Dujari et al. |
| 7,554,203 B2 | 6/2009 | Zhou et al. |
| 7,712,211 B2 | 5/2010 | Chia et al. |
| 7,863,090 B2 | 1/2011 | Eichelberger et al. |
| 8,304,913 B2 | 11/2012 | Nalla et al. |
| 8,555,495 B2 | 10/2013 | Chia et al. |
| 8,580,616 B2 | 11/2013 | Nalla et al. |
| 9,484,225 B2 | 11/2016 | Poo et al. |
| 2008/0000087 A1* | 1/2008 | Kuczynski ............ H01L 23/473 29/890.03 |
| 2009/0040715 A1* | 2/2009 | Sunohara ............. H01L 23/473 361/679.46 |
| 2010/0258952 A1* | 10/2010 | Fjelstad ............. H01L 23/5387 257/778 |
| 2012/0193785 A1 | 8/2012 | Lin et al. |
| 2013/0258599 A1* | 10/2013 | Danello ................ H01L 23/433 361/706 |
| 2014/0162449 A1* | 6/2014 | An .................... H01L 21/76885 438/613 |
| 2015/0340314 A1* | 11/2015 | Kim ..................... H01L 23/528 257/770 |
| 2016/0086898 A1* | 3/2016 | Jang ....................... H01L 24/09 257/774 |
| 2016/0372448 A1 | 12/2016 | Yazdani |

\* cited by examiner

INTERCHIP BACKSIDE CONNECTION

BACKGROUND

The present application relates to semiconductor chip packaging. More particularly, the present application relates to a multi-chip module (MCM) structure in which heat dissipation is improved by providing a heat sink and a cooling element above wire bonds that provide a backside connection between individual semiconductor chips of the multi-chip module structure. The present application also provides a method of forming such a MCM structure.

A multi-chip module (MCM) (sometimes referred to a complex hybrid microcircuit) is an electronic package consists of multiple integrated circuits (ICs or "chips") that are assembled into a single device. MCMs are commonly used in the following devices: RF wireless modules, power amplifiers, high-power communication devices, servers, high-density single-module computers, wearable electronic devices, LED packages, portable electronics and space avionics.

An MCM works as a single component and is capable of handling an entire function. The various components of an MCM are mounted on a substrate and the bare semiconductor dies of the substrate are connected to the surface via wire bonding, tape bonding or flip-chip bonding. The module can be encapsulated by a plastic molding and is mounted to a printed circuit board. MCMs offer better performance and can reduce size of a device considerably.

Despite the improvements that can be afforded by utilizing MCMs, MCMs may have a problem with heat dissipation, especially when chips are stack on top of each other. There is thus a need for providing an MCM structure which reduces heat dissipation.

SUMMARY

A multi-chip module (MCM) structure is provided, where a combination of wire bonds and controlled collapse chip connection (C4) are utilized, and in which heat dissipation is improved by providing a heat sink and a cooling element above wire bonds that provide a backside connection between individual semiconductor chips of the multi-chip module structure.

One aspect of the present application relates to a multi-chip module (MCM) structure having improved heat dissipation. In one embodiment, the multi-chip module structure may include a plurality of semiconductor chips having a front side mounted on a packaging substrate by a controlled collapse chip connection (C4), wherein each semiconductor chip of the plurality of semiconductor chips further comprises a plurality of through-substrate vias located at a backside of each semiconductor chip of the plurality of semiconductor chips. A plurality of wire bonds is present that interconnect each semiconductor chip of the plurality of semiconductor chips and is located at the backside of each semiconductor chip of the plurality of semiconductor chips. A heat sink is located above a gap containing the plurality of wire bonds, and a cooling element is located on a surface of the heat sink.

Another aspect of the present application relates to a method of forming a multi-chip module structure having improved heat dissipation. In one embodiment, the method may include providing a plurality of semiconductor chips, each semiconductor chip of the plurality of semiconductor chips having a front side and a backside, wherein a plurality of through-substrate vias is located at the backside of each semiconductor chip of the plurality of semiconductor chips. Next, the front side of each semiconductor chip of the plurality of semiconductor chips is mounted on a packaging substrate. A plurality of wire bonds is then formed to provide interconnection between each semiconductor chip of the plurality of semiconductor chips. Each wire bond of the plurality of wire bonds is located at the backside of each semiconductor chip of the plurality of semiconductor chips. Next, a heat sink is formed above a gap containing the plurality of wire bonds, and thereafter, a cooling element is provided on a surface of the heat sink.

DETAILED DESCRIPTION

Figure 1:
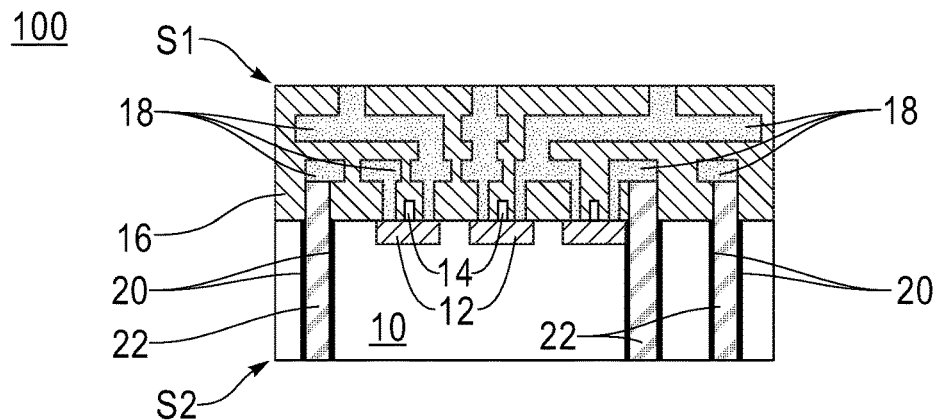
FIG. 1 is a cross sectional view of an exemplary semiconductor chip containing a plurality of through-substrate vias that are present on a backside of the semiconductor chip that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a multi-chip module (MCM) structure where a combination of wire bonds and controlled collapse chip connection (C4) are utilized, and in which heat dissipation is improved by providing a heat sink and a cooling element above wire bonds that provide a backside connection between individual semiconductor chips of the multi-chip module structure. The present application also provides a method of forming such a structure.

Referring first to FIG. 1, there is illustrated an exemplary semiconductor chip 100 that can be employed in accordance with an embodiment of the present application. The semiconductor chip 100 includes a front side, S1, and a backside, S2. The semiconductor chip 100 further contains a plurality of through-substrate vias 22 that are present on the backside, S2, of the semiconductor chip 100. The plurality of through-substrate vias 22 extend entirely through a semiconductor substrate 10 and into a portion of an interconnect dielectric material 16. In some embodiments, and as is shown, a diffusion barrier 20 may be present lining the through-substrate vias 22 that is embedded in the semiconductor substrate 10. The interconnect dielectric material 16 includes a plurality of interconnect structures 18 embedded therein. As is shown, each through-substrate via 22 of the plurality of through-substrate vias 22 contacts a surface of one of the interconnect structures 18 that are embedded in the interconnect dielectric material 18.

The semiconductor chip 100 further includes a plurality of semiconductor devices such as, for example, field effect transistors. Each field effect transistor may include an active semiconductor region 12 that includes a channel region separating a source region from a drain region. Each field effect transistor also includes a gate structure 14 that includes at least a gate dielectric material and a gate conductor material.

The exemplary semiconductor chip 100 can be formed utilizing techniques well known to those skilled in the art. For example, the exemplary semiconductor chip 100 can be formed by first selecting a semiconductor substrate 10 as defined herein below. After selecting the semiconductor substrate 10, the plurality of semiconductor devices can be formed on a surface of the semiconductor substrate 10 utilizing techniques well known to those skilled in the art. For example, field effect transistors can be formed by providing a gate stack of a gate dielectric material and a gate conductor material on a surface of the semiconductor substrate 10. The gate stack can then be patterned to provide the gate structure 14. P-type or n-type dopants can be introduced into the semiconductor substrate 10 and at the footprint of each gate structure 14 so as to define the active semiconductor region 12. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

Next, one or more interconnect levels including one or more interconnect dielectric materials 16 and a plurality of interconnect structures 18 can be formed utilizing processes well known in the art. Through-substrate vias 22, which may contain a diffusion barrier 20 can then be formed utilizing techniques well known to those skilled in the art. The substrate 10 can then be singulated, i.e., diced, to provide the semiconductor chip 100 of FIG. 1.

The semiconductor substrate 10 that can be employed includes a least one semiconductor material such as, for example, silicon (Si), germanium (Ge), a silicon germanium alloy (SiGe), silicon carbide (SiC), silicon germanium carbide (SiGeC), a III-V compound semiconductor and/or a II-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. The semiconductor substrate 10 may be a bulk semiconductor (i.e., a substrate that is entirely composed of one of the above mentioned semiconductor materials) or a semiconductor-on-insulator (SOI) substrate. An SOI substrate includes a handle substrate, a buried insulator layer, and a topmost semiconductor material.

The gate dielectric material of each gate structure 14 may be composed of an oxide, nitride and/or oxynitride. In some embodiments, the gate dielectric material can be a high-k material having a dielectric constant of greater than silicon dioxide. Exemplary high-k materials includes, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material.

The gate conductor material of the gate structures 14 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material may comprise an nFET gate metal. In another embodiment, the gate conductor material may comprise a pFET gate metal.

The at least one interconnect dielectric material 16 may be composed of a dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the interconnect dielectric material 16. Each interconnect structure of the plurality of interconnect structures 18 includes an interconnect metal or metal alloy such as, for example, copper (Cu), aluminum (Al), tungsten (W) or a copper-aluminum (Cu—Al) alloy. As is shown, some of the interconnect structures 18 contact portions of the active semiconductor region 12. Also, some of the interconnect structures 18 that are present in the interconnect dielectric material 16 have a topmost surface that is coplanar with a topmost surface of the interconnect dielectric material 16.

Each through-substrate via 22 (or TSV 22) is a vertical electrical contact that passes completely through the semiconductor substrate 10. Each TSV 22 may be composed of a conductive material such as, for example, copper (Cu) or tungsten (W). When present, the barrier layer 20 may be a single or multilayered structure that is composed of a material that prohibits the diffusion of the conductive atoms from the TSV 22 into the semiconductor substrate 10. In some embodiments, the barrier layer 20 may be composed of titanium nitride or tantalum nitride. Each TSV 22 can be formed by providing a via to the structure, filling a portion of the via with the barrier layer 20 and then filling the remainder of the via with a conductive material.

Figure 2:
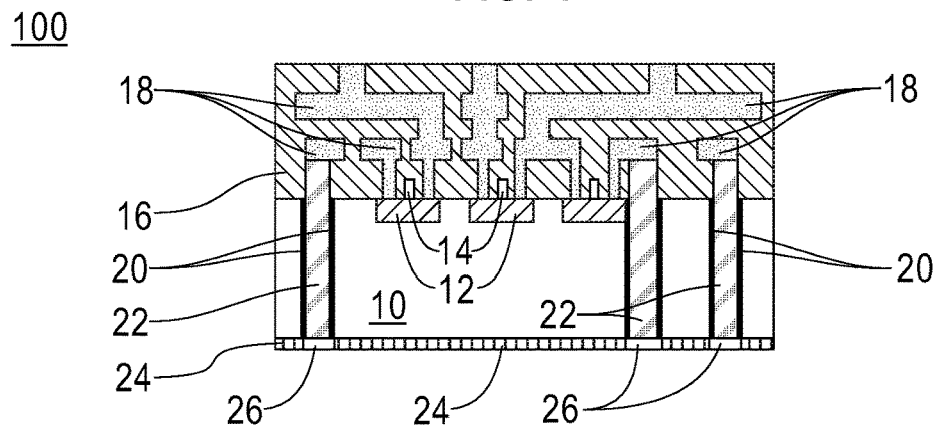
FIG. 2 is a cross sectional view of the exemplary semiconductor chip of FIG. 1 after forming a dielectric material on the backside of the semiconductor chip, the dielectric material contains openings that are filled with a metal bond pad.

Referring now to FIG. 2, there is illustrated the exemplary semiconductor chip of FIG. 1 after forming a dielectric material 24 on the backside, S2, of the semiconductor chip 100. In the illustrated embodiment shown in FIG. 2, the dielectric material contains openings that are filled with a metal bond pad 26. In another embodiment of the present application, the dielectric material contains openings that are devoid of any metal bond pad (such an embodiment is depicted in the exemplary MCM structure shown in FIG. 7 of the present application).

The dielectric material 24 includes any passivation material such as, for example, silicon nitride. The dielectric material 24 can be formed onto the backside, S2, of the semiconductor chip 100 utilizing a deposition process such as, for example, chemical vapor deposition or plasma enhanced chemical vapor deposition. The dielectric material 24 may have a thickness from 10 nm to 200 nm. Other thicknesses for the dielectric material 24 are contemplated and can be used for the thickness of the dielectric material 24. Openings are then formed into the deposited dielectric material 24. The openings can be formed by lithography and etching. The openings may be filled with a metal bond pad 26. The metal bond pad 26 may be composed of a conductive material such as, for example, aluminum (Al), cobalt (Co), copper (Cu), tungsten (W) or alloys thereof. The metal bond pads can be formed by deposition of the conductive material. A planarization process or a patterning process may follow the deposition of the conductive material that provides the metal bond pads 26. In some embodiments, and as shown, each metal bond pad 26 has a bottommost surface that is coplanar with a bottommost surface of the dielectric material layer 24.

Figure 3:
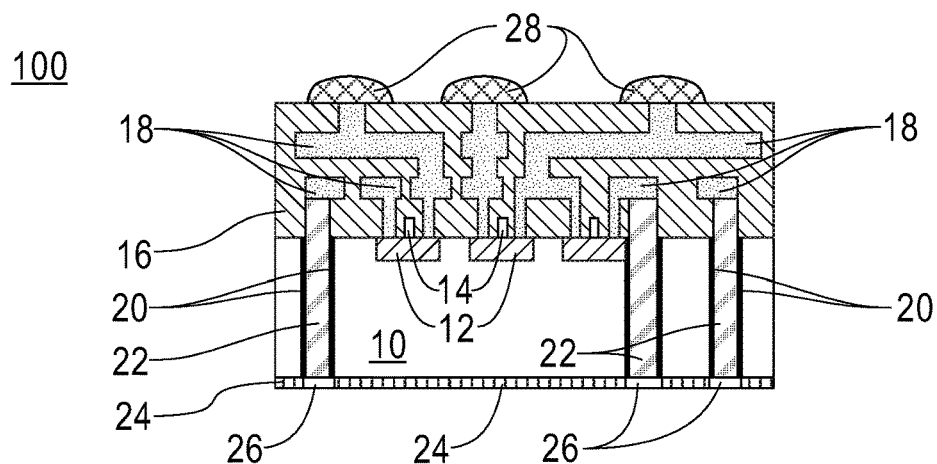
FIG. 3 is a cross sectional view of the exemplary semiconductor structure of FIG. 2 after forming solder bumps on a front side of the semiconductor chip.

Referring now to FIG. 3, there is illustrated the exemplary semiconductor structure of FIG. 2 after forming solder bumps 28 on the front side, S1, of the semiconductor chip 100. As is shown, each solder bump 28 contacts a surface of one of the interconnect structures 18 that is present in the interconnect dielectric material 16. Each solder bump 28 that is employed in the present application includes any fusible metal or metal alloy that can be used to create a permanent bond between two work pieces. Examples of solderable materials that can be used as the solder bumps 28 include, but are not limited to, gold, tin, lead, and indium. Typically, lead-free solderable materials such as tin-based solders (e.g., tin-copper alloys) are employed as the solder bumps 28. Each solder bump 28 may be formed by deposition of the solderable material through a solder mask. The solder bumps 28 provide a controlled collapse chip connection (C4).

Figure 4:
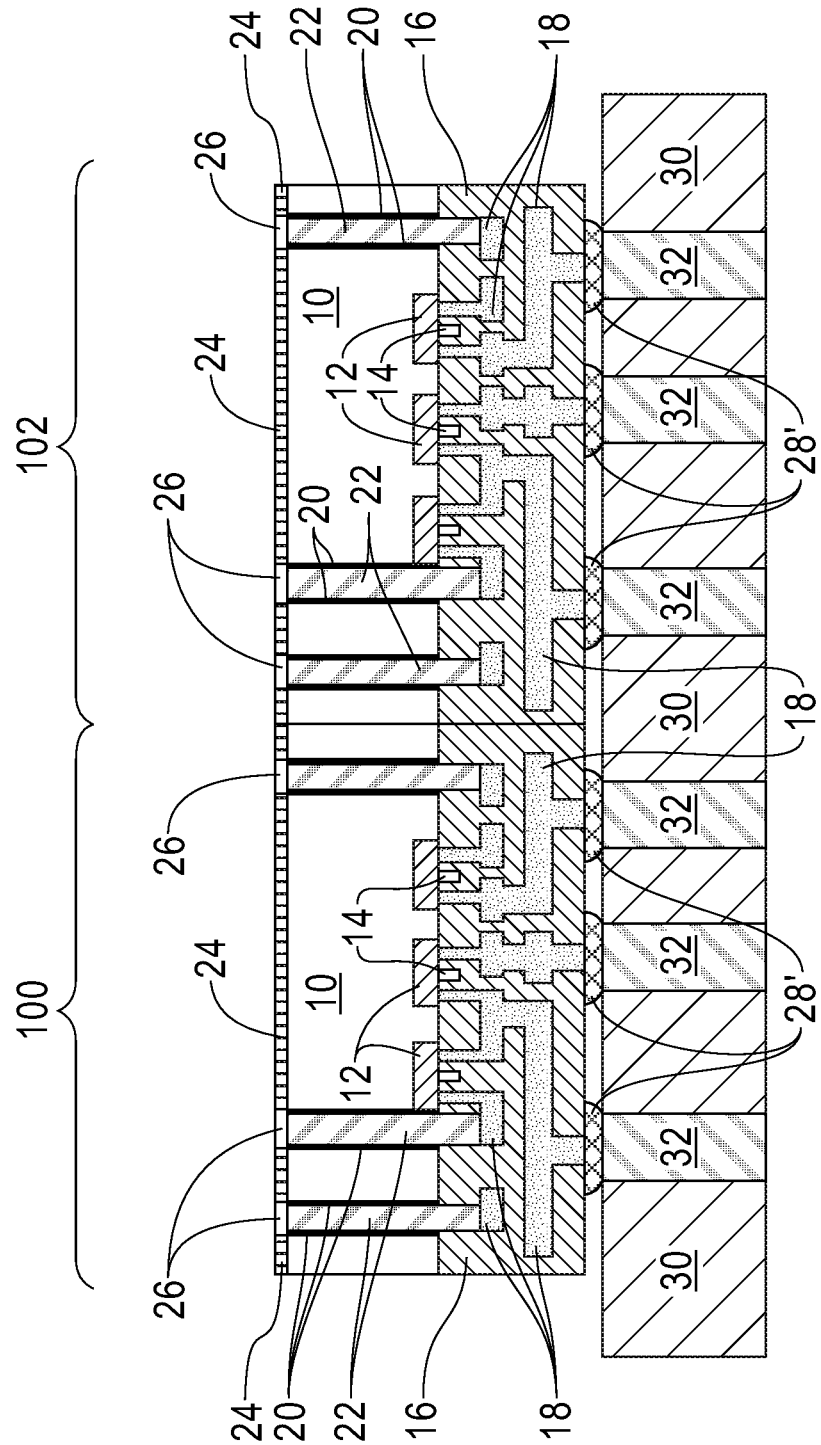
FIG. 4 is a cross sectional view of a multi-chip module (MCM) structure after mounting multiple semiconductor chips, one chip of which shown in FIG. 3, on a surface of a packaging substrate.

Referring now to FIG. 4, there is shown a multi-chip module (MCM) structure that can be formed after mounting multiple semiconductor chips (100, 102, etc.) on a surface of a packaging substrate 30. In some embodiments, the semiconductor chips may be vertical stacked prior to mounting. The semiconductor chips (100, 102, etc.) may provide different functions. For example, semiconductor chip 100 may provide CPU functions, while semiconductor chip 102 may provide GPU functions. Alternatively, semiconductor chip 100 may provide memory functions, while semiconductor chip 102 may provide ASIC functions.

The packaging substrate 30 may be composed of a semiconductor material such as silicon, glass, or an organic laminate. The packaging substrate 30 may contain through-semiconductor vias 32 or other electrically conductive structures.

Mounting can be performed by first positioning the semiconductor chips (100, 102, etc.) above the packaging substrate 30 such that the solder bumps 28 of each chip is aligned with the through-semiconductor vias 32 of the underlying packaging substrate. Next, the workpieces (i.e., semiconductor chip(s) and packaging substrate) are brought into intimate contact with each other, and then a bonding anneal is performed. The bonding anneal is performed at a temperature in which the solder bumps melt and reflow, and then during cooling an electrically conductive solder joint is formed between the workpieces. A controlled collapse chip connection (C4) is provided by the annealed solder bumps 28.

Figure 5:
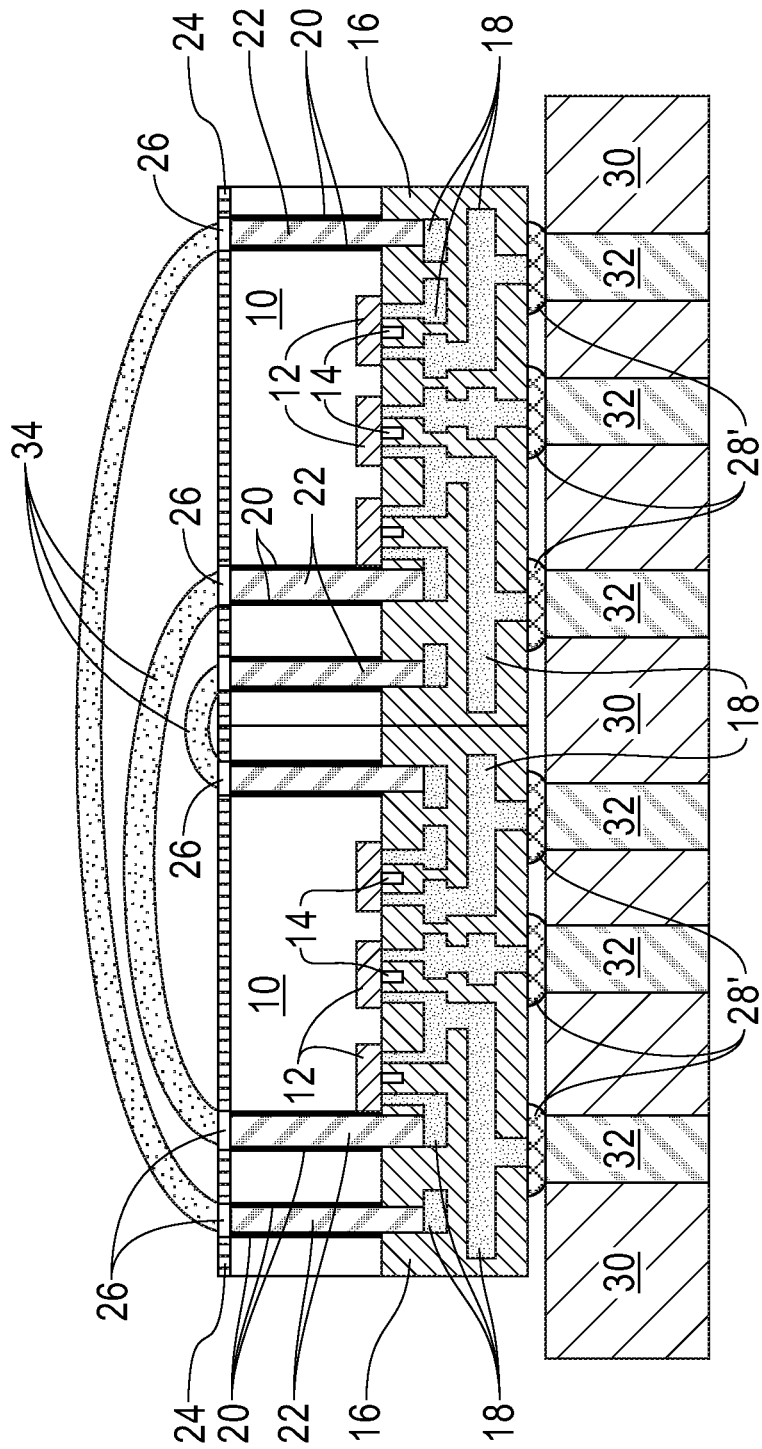
FIG. 5 is a cross sectional view of the exemplary MCM structure of FIG. 4 after forming wire bonds between through-substrate vias of the various chips.
Figure 7:
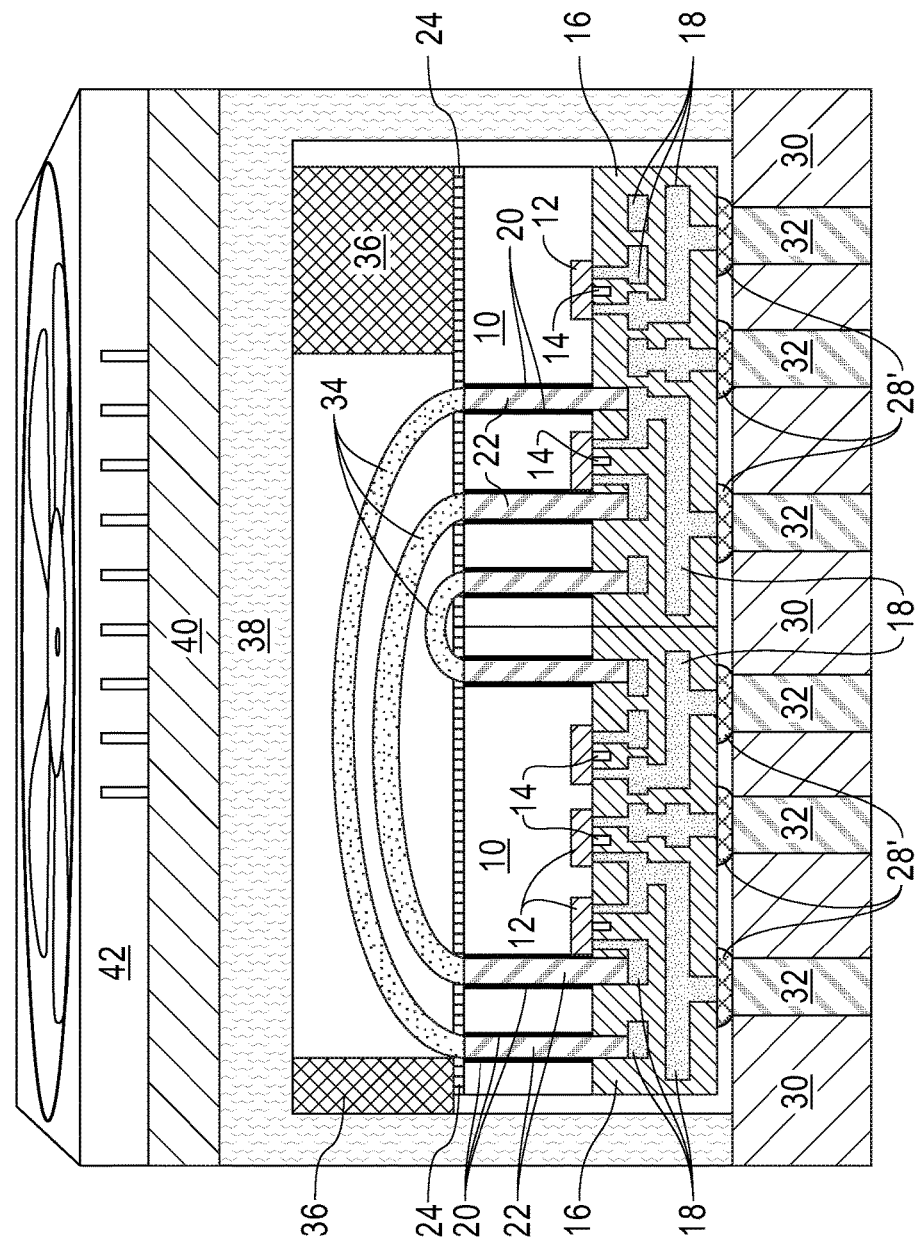
FIG. 7 is a cross sectional view of another exemplary MCM structure of the present application in which a thermal paste is applied in regions of a gap not containing wire bonds.

Referring now to FIG. 5, there is illustrated the exemplary multi-chip module (MCM) structure of FIG. 4 after forming wire bonds 34 between through-substrate vias 22 of the various chips (100, 102, etc). The wire bonds 34 may be formed by utilizing any wire bonding process including, for example, ball bonding, wedge bonding and compliant bonding. The wire bonds 34 may be composed of one of aluminum (Al), copper (Cu), silver (Ag) and gold (Au). In the embodiment illustrated in FIG. 5, each end of each wire bond 34 is in direct contact with a surface of one of the metal bond pad 26. In another embodiment, and as shown in FIG. 7, each end of each wire bond 34 is in direct contact with a surface of through-substrate via 22.

Figure 6:
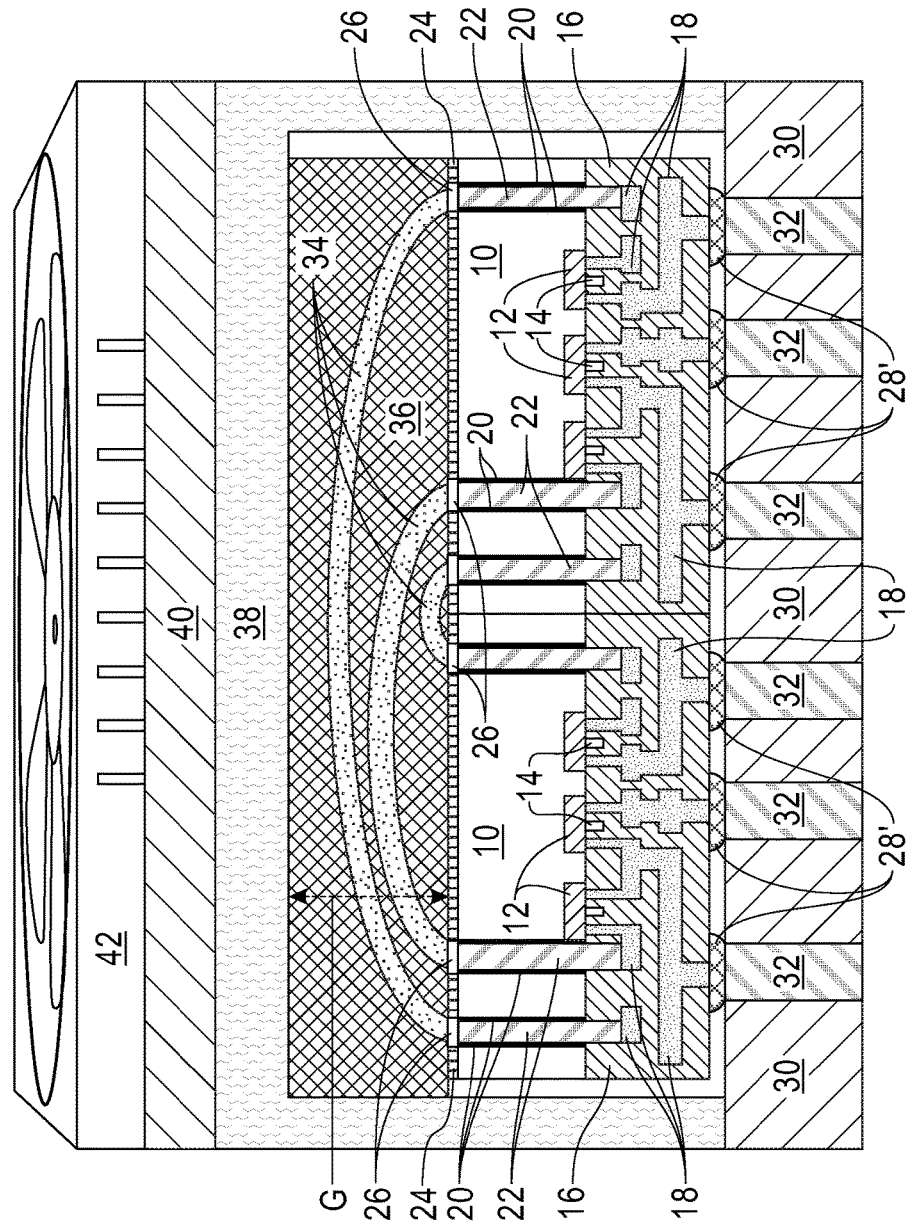
FIG. 6 is a cross sectional view of the exemplary MCM structure of FIG. 5 after forming a thermal paste, a dielectric cap, a heat sink, and a cooling element.

Referring now to FIG. 6, there is illustrated the exemplary MCM structure of FIG. 5 after forming a thermal paste 36, a dielectric structure 38, a heat sink 38, and a cooling element 42. In this embodiment, the thermal paste 36 is present in a gap, G, located between the dielectric material 24 and a cap portion of the dielectric structure 38; in the illustrated embodiment, the thermal paste 36 entirely surrounds each wire bond 34.

The thermal paste 36 is composed of an insulator that has a thermal coefficient of expansion (TCE) that matches the material of the wire bonds 34 such that no stress is introduced into the wire bonds 34. In one example, the thermal paste is composed of a thermal conductive epoxy. The thermal paste 36 can be applied to the structure prior to forming the dielectric structure 38.

The dielectric structure 38 includes a horizontal cap portion and vertical sidewalls. The horizontal cap portion of the dielectric structure 38 is located between the gap, G, containing the plurality of wire bonds 34 and the heat sink 40, and the vertical sidewalls of the dielectric structure 38 laterally surrounds the gap, G, and the plurality of semiconductor chips (100, 102, etc). A portion of the dielectric structure 38 may be in direct physical contact with a surface of the packaging substrate 30. The dielectric structure 38 may include any passivation material such as silicon nitride. The dielectric structure 38 may be formed by deposition of a passivation material.

Heat sink 40 is then formed on the dielectric structure 38. Heat sink 40 includes any metal or metal alloy having a large surface area. By "large surface area" it is meant a surface area that cover most of the area available from the package. Examples of metals or metal alloys that may be used as heat sink 40 include, but are not limited to aluminum (Al) or steel (i.e., an alloy of iron and other elements, primarily carbon). The heat sink 40 may be formed by a deposition process including, but not limited to, chemical vapor deposition, plasma enhanced chemical vapor deposition, sputtering, or plating. The heat sink 40 may have a thickness from 10 nm to 200 nm. A cooling element 42, such as fan, is then provided on an exposed surface of the heat sink 40.

Referring now to FIG. 7, there is illustrated another exemplary MCM structure of the present application in which thermal paste 36 is applied in regions of the gap, G, not containing wire bonds 34. In this embodiment, the thermal paste 36 can be formed selectively in regions of the gap, G, not containing wire bonds 34. In some embodiments, the thermal paste 36 of this embodiment can be provided utilizing a patterning process.

FIGS. 6 and 7 illustrate exemplary MCM structures of the present application. Each of the MCM structures includes a plurality of semiconductor chips (100, 102, etc) having a front side, 51, mounted on a packaging substrate 30 by a controlled collapse chip connection (C4), wherein each semiconductor chip of the plurality of semiconductor chips (100, 102, etc.) further comprises a plurality of through-substrate vias 22 located at a backside, S2, of each semiconductor chip of the plurality of semiconductor chips (100, 102, etc.). A plurality of wire bonds 24 is present that provides interconnection between each semiconductor chip of the plurality of semiconductor chips (100, 102, etc.) and is located at the backside, S2, of each semiconductor chip of the plurality of semiconductor chips (100, 102, etc.). A heat sink 38 is located above a gap, G, containing the plurality of wire bonds 34, and a cooling element 42 is located on a surface of the heat sink 40.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A multi-chip module structure comprising:
    a plurality of semiconductor chips having a front side mounted by a controlled collapse chip connection (C4) on a packaging substrate, wherein each semiconductor chip of the plurality of semiconductor chips further comprises a plurality of through-substrate vias located at a backside of each semiconductor chip of the plurality of semiconductor chips;
    a plurality of wire bonds interconnecting each semiconductor chip of the plurality of semiconductor chips and located at the backside of each semiconductor chip of the plurality of semiconductor chips;
    a heat sink located above a gap containing the plurality of wire bonds; and
    a cooling element located on a surface of the heat sink, wherein a dielectric structure is located between the gap containing the plurality of wire bonds and the heat sink and laterally surrounding the gap and the plurality of semiconductor chips, and wherein the dielectric structure has a surface that is in direct physical contact with a surface of the packaging substrate.

2. The multi-chip module structure of claim 1, wherein the gap is completely filled with a thermal paste.

3. The multi-chip module structure of claim 1, wherein the gap is partially filled with a thermal paste.

4. The multi-chip module structure of claim 1, wherein the cooling element is a fan.

5. The multi-chip module structure of claim 1, wherein each semiconductor chip of the plurality of semiconductor chips comprises a dielectric material on the backside of the semiconductor chip, each dielectric material having openings, wherein each opening exposes a surface of one of the through-substrate vias.

6. The multi-chip module structure of claim 5, wherein the openings are filled with a metal bond pad that is in contact with the exposed surface of one of the through-substrate vias.

7. The multi-chip module structure of claim 6, wherein the wire bonds directly contact the metal bond pad within the openings of the dielectric material.

8. The multi-chip module structure of claim 5, wherein each of the wire bonds directly contacts the physical exposed surface of the through-substrate vias.

9. A method of forming a multi-chip module structure, the method comprising:
    providing a plurality of semiconductor chips, each semiconductor chip of the plurality of semiconductor chips having a front side and a backside, wherein a through-substrate via is located at the backside of each semiconductor chip of the plurality of semiconductor chips;
    mounting the front side of each semiconductor chip of the plurality of semiconductor chips on a packaging substrate;
    forming a plurality of wire bonds to provide interconnection between each semiconductor chip of the plurality of semiconductor chips, each wire bond of the plurality of wire bonds is located at the backside of each semiconductor chip of the plurality of semiconductor chips;
    forming a dielectric structure laterally surrounding the plurality of semiconductor chips and a gap containing the plurality of wire bonds, wherein the dielectric structure has a surface that is in direct physical contact with a surface of the packaging substrate,
    forming a heat sink on the dielectric structure and above the gap containing the plurality of wire bonds; and
    providing a cooling element on a surface of the heat sink.

10. The method of claim 9, wherein the gap is completely filled with a thermal paste prior to forming the heat sink.

11. The method of claim 9, wherein the gap is partially filled with a thermal paste prior to forming the heat sink.

12. The method of claim 9, wherein each semiconductor chip of the plurality of semiconductor chips comprises a dielectric material on the backside of the semiconductor chip, each dielectric material having openings, wherein each opening exposes a surface of one of the silicon through vias.

13. The method of claim 12, wherein the openings are filled with a metal bond pad that is in contact with the exposed surface of one of the through-substrate vias.

14. The method of claim 13, wherein the wire bonds directly contact the metal bond pad within the openings of the dielectric material.

15. The method of claim 12, wherein each of the wire bonds directly contacts the physical exposed surface of the through-substrate vias.

16. The method of claim 9, wherein the mounting comprises:
   forming a plurality of solder balls of the front side of each semiconductor chip of the plurality of semiconductor chips; and
   performing an anneal.

17. The method of claim 9, wherein the cooling element comprises a fan.

\* \* \* \* \*